United States Patent [19]

Kashiwagi

[11] 4,042,859

[45] Aug. 16, 1977

[54] HORIZONTAL DEFLECTION CIRCUIT OF A TELEVISION RECEIVER WITH MEANS TO ELIMINATE GENERATION OF DANGEROUS HIGH POTENTIAL UNDER FAULTY CONDITION

[75] Inventor: Shigeru Kashiwagi, Yokohama, Japan

[73] Assignee: Victor Company of Japan, Limited, Japan

[21] Appl. No.: 690,794

[22] Filed: May 28, 1976

[30] Foreign Application Priority Data

May 31, 1975 Japan .................................. 50-72765

[51] Int. Cl.$^2$ ............................................. H04N 1/38
[52] U.S. Cl. ................................... 315/411; 358/190; 358/243
[58] Field of Search ..................... 315/411, 379, 380; 358/190, 243

[56] References Cited

U.S. PATENT DOCUMENTS

| | | | |
|---|---|---|---|
| 3,688,031 | 8/1972 | Fitzgerald, Jr. et al. | 358/243 |
| 3,692,932 | 9/1972 | Wilmarth | 358/243 |
| 3,715,464 | 2/1973 | Sendelweck | 358/190 |
| 3,740,472 | 6/1973 | Fitzgerald, Jr. | 358/243 |
| 3,881,135 | 4/1975 | Dietz | 315/411 |

*Primary Examiner*—Samuel Engle
*Assistant Examiner*—S. A. Cangialosi
*Attorney, Agent, or Firm*—Robert E. Burns; Emmanuel J. Lobato; Bruce L. Adams

[57] ABSTRACT

A horizontal deflection circuit of a television receiver comprises series-connected first and second capacitors resonated with the deflection coil to provide an oscillating current during the retrace period of horizontal scanning. A switching transistor is provided to disable the deflection coil when rendered conductive. A negative bias voltage is derived from the juncture between the first and second capacitors. A positive bias voltage is derived from the flyback transformer and applied to the base of the transistor together with the negative bias voltage. Under the normal condition of the circuit, the resultant voltage at the base of transistor holds it under the blocking state. Should the first capacitor become faulty, the transistor is biased into the conducting state by the positive potential to disable the circuit.

5 Claims, 4 Drawing Figures

HORIZONTAL DEFLECTION CIRCUIT OF A TELEVISION RECEIVER WITH MEANS TO ELIMINATE GENERATION OF DANGEROUS HIGH POTENTIAL UNDER FAULTY CONDITION

The present invention relates generally to television receivers, and in particular to a horizontal deflection circuit in which the occurrence of an X-ray producing high potential due to the failure of a circuit component is prevented.

The kinescope of a conventional television receiver is usually provided with a positive anode potential which is as high as 20 kilovolts. However, if the anode potential reaches a level as high as 30 kilovolts an X-ray will be produced by the highly accelerated electron beam. To protect the viewers from dosing an excessive amount of X-ray radiation from the television receiver, and allowable limit has been set up to check for any faulty receiver exceeding the limit. Such X-ray producing high potentials could occur when the capacitor which resonates with the horizontal deflection coil to produce an oscillating current during the retrace interval should become faulty.

Therefore, an object of the invention is to provide an improved horizontal deflection circuit of a television receiver in which an X-ray producing high potential is avoided by detecting the faulty condition of the capacitor.

Another object of the invention is to provide an improved horizontal deflection circuit which is disabled at predetermined intervals to reduce the anode potential to a level lower than the X-ray producing dangerous potential.

The horizontal deflection circuit comprises a resonant circuit including a deflection coil and a retrace capacitor tuned with the deflection coil and the inductance of a flyback transformer with its primary winding connected to the resonant circuit to generate an oscillating current during the retrace interval of horizontal scanning. In accordance with the invention, the retrace capacitor is comprised by series-connected first and second capacitors. A diode is connected in parallel with the second capacitor to develop a negative pulsating voltage thereacross during each retrace period. The flyback transformer is provided with a secondary winding for the supply of a high positive potential to the anode of a kinescope and a tertiary winding from which a positive DC voltage is derived. The negative pulsating voltage is smoothed into a negative DC voltage and is applied to the base of a switching transistor together with the positive DC voltage. The resultant voltage or difference in potential between the negative and positive DC voltages, at the base of transistor under normal operating condition of the deflection circuit holds the transistor under the blocking state. Should the first capacitor fail, the negative voltage will disappear and as a result the positive DC voltage then biases the transistor into the conducting state. The conduction of the switching transistor is thus an indication of a faulty condition of the horizontal deflection circuit and utilized to disable it.

The disabling of the deflection circuit reduces the anode potential derived from the transformer secondary in addition to the positive DC voltage at the base of now conducting transistor. Therefore, the deflection circuit goes into operation again. This process will be repeated and the deflection circuit goes on and off at predetermined intervals so that the anode voltage is held at a value well below the X-ray producing potential.

Because the interruption of deflection circuit is under the control of the positive DC voltage and because the latter is obtained from the flyback transformer, a possible sudden voltage drop across the retrace capacitor due to some spark discharge within the envelope of the kinescope will permit the deflection circuit to automatically resume operation immediately after the spark discharge has disappeared.

These and other objects and advantages of the invention will be understood from the following description taken in conjunction with the accompanying drawings, in which.

Figure 1:
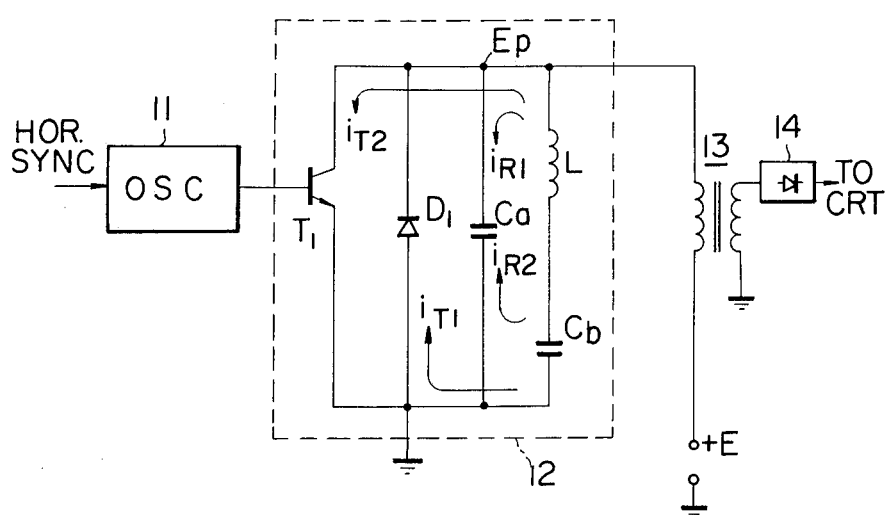
FIG. 1 is a prior art horizontal deflection circuit useful for describing the operation of the circuit.

Before describing the embodiment of the present invention, reference is first had to FIG. 1 in which the conventional horizontal deflection circuit of a television receiver is shown. The circuit 10 comprises a horizontal oscillator 11 which derives its trigger signal from a sync separator (not shown) of the television receiver which is adapted to receive television signals including horizontal and vertical sync pulses as well as a video signal. The horizontal oscillator 11 generates square wave pulses in step with the input trigger pulses and applies its output to the base of a transistor $T_1$ of a horizontal output circuit 12. Transistor $T_1$ has its emitter connected to ground and its collector connected to a positive voltage supply $+E$ through the primary winding of a flyback transformer 13. A damper diode $D_1$ is reversely parallel connected across the collector-to-emitter path of the transistor $T_1$. A capacitor Ca is connected parallel to the diode $D_1$ and in parallel to the capacitor Ca are connected a horizontal deflection coil L and a capacitor Cb connected in series thereto.

Figure 3:
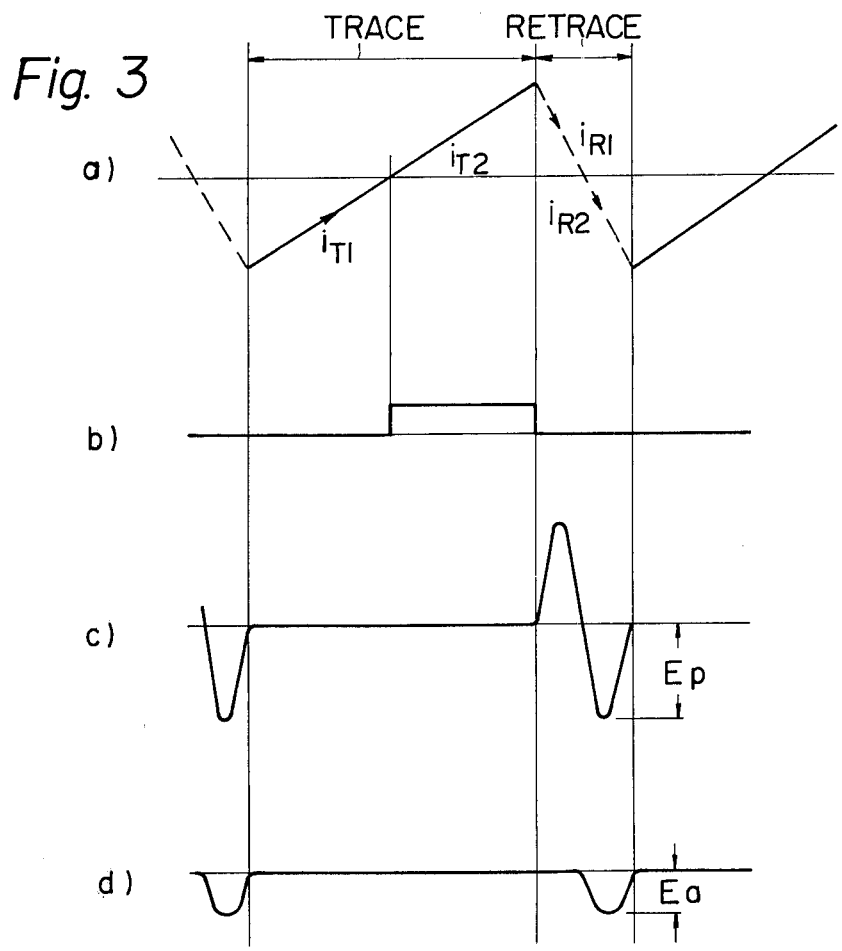
FIG. 3 is a series of waveforms useful for describing the operation of the invention.

The function of the horizontal output circuit 12 is to generate a sawtooth waveform depicted in FIG. 3a. A current flow through the horizontal deflection coil L during the first half of the forward scanning interval, from the left-hand side of the center of the screen, is produced by current $i_{T1}$, and the second half of the forward scanning interval, from the center of the screen to the right-hand side, is produced by current $i_{T2}$. Retrace or flyback is initiated at the end of the $i_{T2}$ interval, and the first half of the retrace period is produced by current $i_{R1}$; the second half of the retrace period is produced by current $i_{R2}$.

During the second half of the forward scanning or trace period, switching transistor $T_1$ controls the current flow to the horizontal deflection coil L. Diode $D_1$ controls the current flow in the horizontal deflection coil during the first half of the trace period. The deflection coil L, capacitor Ca and the primary winding of flyback transformer 13 constitute a resonant circuit which controls the current flow during the retrace period. The oscillator output has a pulse duration which ranges from to the instant that the deflection current is zero to the instant that the deflection current is at its positive peak value, as illustrated in FIG. 3b. When transistor $T_1$ is gated into conduction, a positive charge on capacitor Cb will be released into the conducting transistor $T_1$ to produce current $i_{T2}$ that reversely charges capacitor Cb. Upon turn-off of transistor $T_1$ at the end of the trace period, a counter-electromotive force will be generated in coil L due to its collapsing magnetic lines of flux, giving rise to retrace oscillatory currents through capacitors, Ca, Cb and coil L. During the first half cycle of this retrace oscillation, current $i_{R1}$ charges capacitor Ca which is discharged during the second half cycle producing reverse curent flow $i_{R2}$ to charge capacitor Ca. This charge on capacitor Ca will forwardly bias the diode $D_1$ to render it conductive. At the end of the retrace period, the charge stored on capacitor Cb will be released into the now conducting diode $D_1$ causinga current flow $i_{T1}$. A high AC voltage will be induced in the secondary winding of transformer 13 and rectified by 14 for application to the anode of a kinescope (not shown).

In the circuit configuration of FIG. 1, capacitor Ca will develop a peak voltage $E_p$ as shown in FIG. 3c which is given by the following equation:

$$E_p = \left\{ \frac{\pi}{2} \left( \frac{T_H}{2\pi \sqrt{L_o C_o}} - 1 \right) + 1 \right\} E \quad (1)$$

where,
$L_o$ = combined inductances of coil L and the primary of transformer 13,
$c_o$ = combined capacitances of capacitor Ca and the stray capacitance of the transformer primary,
$T_H$ = trace period,
$E$ = operating voltage of horizontal output circuit 12.

If the capacitor Ca has reduced its capacity for any reason, the peak voltage $E_p$ will increase considerably and as a result the anode voltage on the kinescope will increase abnormally.

In order to overcome this problem, the present invention contemplates to disable the horizontal output circuit 12 at periodic intervals when the capacitor Ca should fail so that the occurrence of an X-ray producing dangerous high voltage is prevented.

Figure 2:
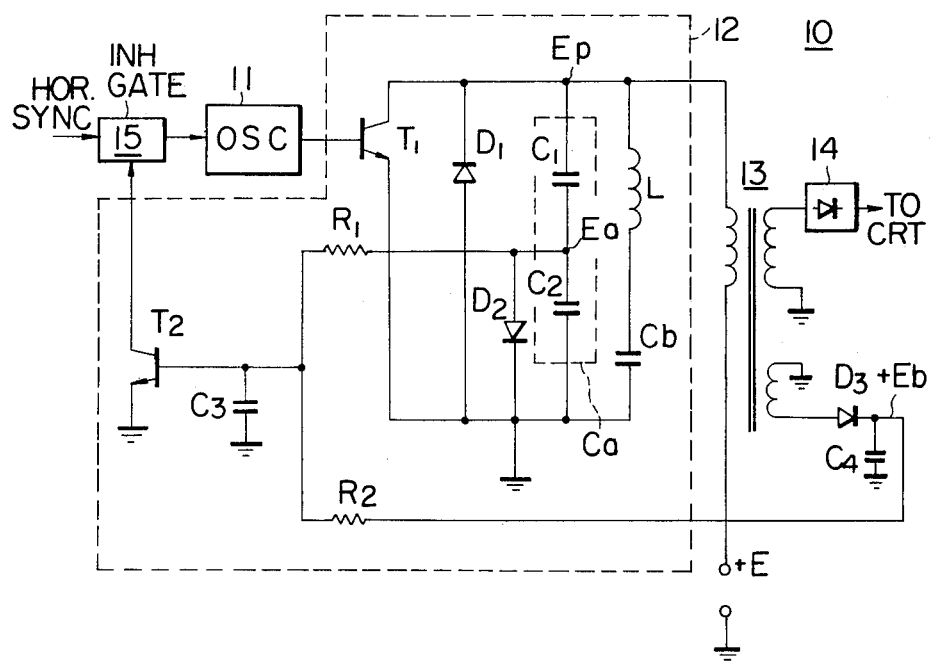
FIG. 2 is a horizontal deflection circuit embodying the present invention.

FIG. 2 illustrates an embodiment of the invention in which like parts are indicated by like numerals used in FIG. 1. In FIG. 2, capacitor Ca shown in brokenline rectangle is comprised by series-connected capacitors $C_1$ and $C_2$, the capacitance of the latter being much greater than that of the former (by the factor of 20, for example). The capacitor $C_2$ develops thereacross a peak voltage $E_a$ which is given by:

$$Ea = \frac{C_1}{C_1 + C_2} \cdot E_p \quad (2)$$

A diode $D_2$ is provided with its anode terminal connected to the juncture between capacitors $C_1$ and $C_2$ and its cathode terminal connected to ground to clamp the peak value of $E_a$ to the ground potential so that voltage $E_a$ is held negative. A switching transistor $T_2$ is provided with its base connected through a resistor $R_1$ to the juncture of capacitors $C_1$ and $C_2$, its emitter being connected to ground and its collector connected to an inhibit gate 15 connected in the path of trigger signal to the oscillator 12. A capacitor $C_3$ is connected between Resistor $R_1$ and ground to constitute a smoothing network with resistor $R_1$. The negative-going pulses each occurring during each retrace period across diode $D_2$ are rectified into a DC voltage by the smoothing network and applied to the base of transistor $T_2$. Also connected to the base of transistor $T_2$ through a resistor $R_2$ is a positive bias voltage source at $+E_b$. This voltage is obtained from a network comprising a rectifying diode $D_3$ with its anode terminal connected to the tertiary winding of the transformer 13 and a filter capacitor $C_4$ connected to the cathode terminal of diode $D_3$ and to ground. Therefore, the base of transistor $T_2$ is biased at a combined value of potentials of $E_a$ and $E_b$. If the base is negatively biased with respect to its emitter, transistor $T_2$ will remain in the blocking state and go into the conducting state when positively biased. The voltage $V_B$ applied to the base of transistor $T_2$ is given by:

$$V_b = (E_b + E_a) \frac{R_1}{R_1 + R_2} - E_a < 0 \quad (3)$$

In order to cause transistor $T_2$ to be maintained off under normal operating condition of the horizontal output circuit 12, the resistors $R_1$, $R_2$ and the positive potential $E_b$ are selected that Equation (3) is satisfied.

Should capacitor $C_1$ fail resulting in a considerable reduction of its capacity, the voltage $E_a$ will suddenly drop and $V_B$ become positive to render transistor $T_2$ conductive. The inhibit gate 15 will then be activated to prevent the passage of sync pulses to the oscillator 11 so that the horizontal output circuit 12 is disabled thereby preventing the occurrence of an X-ray producing dangerous high potential on the anode of the kinescope.

On the other hand, a failure of capacitor $C_2$ presents no serious problem because of its large capacity relative to $C_1$: i.e. only 5% reduction in total capacitance of Ca will result.

Upon turn-on of transistor $T_2$, the positive bias voltage $E_b$ decays with the time until the capacitor $C_4$ has been discharged, with the result that transistor $T_2$ will turn off again. Therefore, oscillator 11 is again activated to supply drive pulses to transistor $T_1$ with the consequent production of the positive voltage $E_b$ with which transistor $T_2$ is turned on again. Transistor $T_2$ is thus turned on and off at periodic intervals determined by the time constant of the $E_b$ supply network, which is selected so that the transistor $T_2$ being turned on and off the kinescope anode potential will remain lower than the X-ray producing dangerous level and under such condition the screen of the kinescope will be dimly lit.

If the positive voltage $E_b$ obtained from a source of constant voltage, the failure of capacitor $C_1$ will result in transistor $T_2$ being maintained on so that the horizontal output circuit 12 is also locked under disabled condition. However, a disadvantage will occur in that a sudden drop of voltage $E_p$ due to some spark discharge in the kinescope interior will keep the output circuit 12 under the disabled condition even if the voltage $E_p$ has been restored to the original level.

It will be appreciated from the foregoing that the embodiment of FIG. 2 has an advantage in that the $E_b$ supply network is connected between the output and input of the horizontal output circuit 12 in a feedback control loop, the possible sudden voltage drop across capacitor Ca permits the circuit 12 to restore its normal function after the cause of the voltage drop has been removed.

Figure 4:
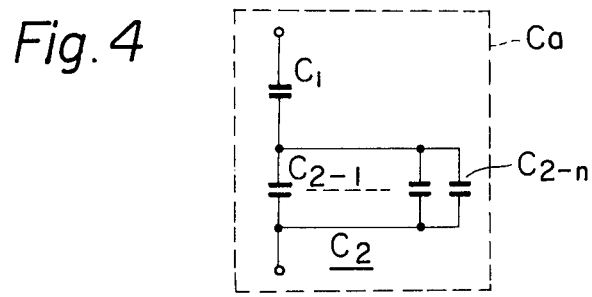
FIG. 4 is a circuit in a preferred form of the invention.

The horizontal deflection circuit of the invention is ensured against a possible failure of capacitors $C_2$ by providing a plurality of parallel-connected capacitors $C_{2-1}$ to $C_{2-n}$ as shown in FIG. 4 instead of a single capacitor $C_2$ so that a failure of one of capacitors $C_{2-1}$ to $C_{2-n}$ does not widely change the total capacity of $C_2$.

What is claimed is:

1. A horizontal deflection circuit for a television receiver adapted to receive television signals including a horizontal synchronization signal, the deflection circuit comprising:
   a resonant circuit including a deflection coil, a first capacitor substantially tuned therewith to provide a first oscillating current during the trace interval, and series-connected second and third capacitors substantially tuned with said coil to provide a second oscillating current during the retrace interval;
   a first gate-controlled switching device;
   a unidirectional conducting device inversely parallel-connected to the first gate-controlled switching device;
   means for applying gating-on pulses to said first gate-controlled switching device to trigger same into conduction in response to said synchronization signal to allow said first oscillating current to pass therethrough during one half of the trace period and then through said unidirectional conducting device during the other half of the trace period;
   means for smoothing a voltage developed across said third capacitor of the resonant circuit to generate a first DC voltage;
   means including a transformer connected to said resonant circuit to generate a second DC potential of opposite polarity to said DC voltage; and
   a second gate-controlled switching device arranged to be triggered by the difference in potential between said first and second DC voltages to prevent the application of said gating-on pulses to the first switching device when said potential difference reaches a predetermined conducting threshold level of the second gate-controlled switching device.

2. A horizontal deflection circuit as claimed in claim 1, wherein said third capacitor is greater than said second capacitor, further including a second unidirectional conducting device connected across said third capacitor to pass the second oscillating current therethrough during one half of the retrace interval.

3. A horizontal deflection circuit as claimed in claim 2, wherein said smoothing means includes a voltage combining network including a first resistor connecting the voltage developed across said third capacitor to the control gate of the second switching device, and a second resistor connecting the second DC voltage to the control gate of the second switching device.

4. A horizontal deflection circuit as claimed in claim 2, wherein said third capacitor comprises a plurality of parallel-connected capacitors.

5. A horizontal deflection circuit as claimed in claim 1, wherein said resonant circuit is connected to a DC voltage source through a primary winding of said transformer, and the series-connected second and third capacitors are connected in parallel to the first switching device.

* * * * *